(12) United States Patent
Wrathall

(10) Patent No.: US 6,809,560 B1
(45) Date of Patent: Oct. 26, 2004

(54) LOAD SENSING CIRCUIT FOR A POWER MOSFET SWITCH

(75) Inventor: Robert S. Wrathall, Scotts Valley, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/618,233

(22) Filed: Jul. 11, 2003

(51) Int. Cl.[7] .............................................. H03K 3/00
(52) U.S. Cl. ...................... 327/108; 327/112; 327/436
(58) Field of Search ...................... 327/108–112, 434, 327/436, 437

(56) References Cited

U.S. PATENT DOCUMENTS

| | | | |
|---|---|---|---|
| 5,003,205 A | 3/1991 | Kohda et al. | 307/475 |
| 5,121,176 A | 6/1992 | Quigg | 357/23.4 |
| 5,128,555 A | 7/1992 | Millman | 307/443 |
| 5,731,694 A | 3/1998 | Wilcox et al. | 323/287 |
| 5,796,287 A | 8/1998 | Furutani et al. | 327/374 |
| 5,912,552 A | 6/1999 | Tateishi | 323/285 |
| 5,973,367 A | 10/1999 | Williams | 257/365 |
| 6,670,796 B2 * | 12/2003 | Mori | 323/282 |

OTHER PUBLICATIONS

Richard K. Williams et al., "The Dual–Gate W–Switched Power MOSFET: A New Concept for Improving Light Load Efficiency in DC/DC Converters", 1997 IEEE International Symposium on Power Semiconductor Devices and ICs, pp. 193–196.

* cited by examiner

Primary Examiner—Kenneth B. Wells
(74) Attorney, Agent, or Firm—Patent Law Group LLP; Carmen C. Cook

(57) ABSTRACT

A circuit for sensing a voltage across a power switch includes a transmission gate, a low pass filter and a comparator. The power switch is controlled by a control signal for turning the power switch on and off to generate a switching voltage at a first current handling terminal of the power switch. The transmission gate is turned on whenever the power switch is turned on to sample the voltage across the power switch when the power switch is turned on. The sampled voltage is filtered by the low pass filter to remove high frequency transients. Finally, the comparator compares the filtered voltage to a reference voltage. The comparator provides an output signal having a first value when the filtered voltage is less than the reference voltage. The circuit can be used as a load sensing circuit to sense the load condition under which the power switch is being operated.

24 Claims, 5 Drawing Sheets

LOAD SENSING CIRCUIT FOR A POWER MOSFET SWITCH

FIELD OF THE INVENTION

The invention relates to a load sensing circuit for a power MOSFET switch and, in particular, to load sensing of a small current in a high ripple condition across a power MOSFET switch.

DESCRIPTION OF THE RELATED ART

A switching regulator, also referred to as a switching mode power supply, provides the power supply function through low loss components such as capacitors, inductors, and transformers, and power switches that are turned on and off to transfer energy from the input to the output in discrete packets. A feedback control circuit is used to regulate the energy transfer to maintain a constant output voltage within certain load limits of the circuit.

FIG. 1 illustrates an output stage of a conventional switching regulator. In FIG. 1, an upper switch 2 (a PMOS transistor) and a lower switch 4 (an NMOS transistor) are connected in series between a positive power supply VIN and ground (or a negative power supply). The switch output voltage $V_{SW}$ (on node 5) of the power switches is coupled to an LC filter circuit 11 to generate an output voltage $V_{OUT}$ (on node 13) having substantially constant magnitude for driving a load 12. The power switches (upper switch 2 and lower switch 4) are controlled by a driver circuit 6 receiving a control signal Gate_Drive on lead 1. Control signal Gate_Drive controls the on and off state of the two power switches. Generally, the control signal Gate_Drive has two active states: a first state for turning on lower switch 4 and turning off upper switch 2 and vice versa for the second state. A passive state can also exist where both switches are turned off. The control signal and related circuitry for putting the power switches in the passive state is not shown in FIG. 1.

Driver circuit 6 generates gate control signals PGATE and NGATE for the upper switch 2 and low switch 4, respectively. FIG. 1 illustrates one exemplary embodiment of a driver circuit which may be used to drive power switches 2 and 4. In FIG. 1, driver circuit 6 includes an upper driver device 7 and a lower driver device 8, each being driven by respective logic circuits 9 and 10. Logic circuits 9 and 10 may include circuit elements for putting upper switch 2 and lower switch 4 in the passive state. Logic circuits 9 and 10 may also include delay circuits for introducing delays to the Gate_Drive control signal for protecting against "shoot-through" conditions at the power switches. Upper driver device 7 and lower driver device 8 drive power switches 2 and 4 in response to control signal Gate_Drive so that only one power switch is turned on at a time. When the control signal Gate_Drive is in its active states, gate control signals PGATE and NGATE are logically equivalent to the Gate_Drive control signal, except for the delays in the PGATE and NGATE signals which may be introduced by the logic circuits 9 and 10 in driver circuit 6 for anti-shoot-through protection.

Control signal Gate_Drive is generated by a feedback control circuit (not shown in FIG. 1) operating to regulate the output voltage $V_{OUT}$ at a certain desired voltage level. A common technique used in the feedback control is pulse-width modulation (PWM). That is, the output voltage $V_{OUT}$ is regulated by controlling the duty cycle, that is, varying the pulse width, of the rectangular voltage $V_{SW}$ applied to the inductor and the capacitor of filter circuit 11. PWM feedback control can be implemented as current mode control or voltage mode control.

Current mode and voltage mode switching regulators are well known in the art and will only be described in brief here. In current mode control, the output voltage $V_{OUT}$ is fed back through a voltage divider to one input of a difference amplifier whose other input is connected to a voltage reference. The output of the difference amplifier is an error voltage. The output current of the switching regulator is sensed and the sensed current signal is compared against the error voltage for generating the Gate_Drive signal to control the power switches. In operation, the upper switch is turned on long enough so that the current in the inductor ramps up to the threshold set by the error voltage. In voltage mode control, the output voltage $V_{OUT}$ is fed back through a voltage divider to one input of a comparator whose other input is connected to a voltage reference. The output of the comparator is an error voltage which error voltage sets the threshold of a second comparator whose other input is coupled to receive a ramp signal. The output of the second comparator forms the control signal Gate_Drive. In operation, the greater the error voltage, the higher the comparator threshold on the second comparator and the longer the upper power switch is held on to provide energy to filter circuit 11.

It is well known that the efficiency of the switching regulator is affected by various factors including conduction losses from the internal resistance of the MOS transistors used as the power switches and gate drive losses due to charging and discharging of the MOS transistors' gate capacitance. The load condition at which the switching regulator is being operated also has a significant impact on the efficiency of the switching regulator. Specifically, switch regulators can become very inefficient at light load (low output current) conditions due to the large gate current required to charge the large gate capacitance of the power switches. Thus, switching regulators typically employ some form of current sensing at the lower switch to detect a light load condition and adjust the regulator operation in response in order to maintain regulator efficiency.

In general, a current mode switching regulator uses current sense techniques to detect light load conditions and responds to the light load conditions by varying the switching frequency of the switch output voltage $V_{SW}$. Specifically, the switching frequency is reduced in light load conditions so that the charging and discharging of the large gate capacitance of the power transistors no longer represent a significant power loss for the switching regulator. Varying frequency operation can be effective in improving light load efficiency but presents some undesirable side effects. First, varying the switching frequency requires a finite amount of time such that such a current mode switching regulator often cannot be operated at very high speed. Also, varying the switching frequency introduces a wide noise spectrum which cannot be readily filtered out. The introduction of a wide noise spectrum prevents the switching regulator from being used in communication equipments where the undesired noise spectrum may interfere with the transmitted signals. However, when these side effects are taken into considerations, current mode switching regulators can effectively employ a varying frequency operation to improve light load efficiency. Of course, varying frequency operation can also be applied in a voltage mode switching regulator for improving light load efficiency.

However, the conventional current sense techniques for light load detection are not desirable for voltage mode switching regulators. Conventional current sense techniques typically involve using a resistor at the NMOS transistor (the lower switch) to measure the current flowing through the NMOS transistor. Other current sensing techniques include measuring the voltage across the NMOS transistor directly. These techniques are not suitable for voltage mode switching regulators because of the switching requirements of the switch output voltage $V_{SW}$ at the common node of the power switches.

FIG. 2 illustrates representative voltage waveform of voltage $V_{SW}$ at the common node of the power switches during the operation of a voltage mode switching regulator. In operation, there is typically a ripple current of about 100 mA in the lower switch (an NMOS transistor). To detect light load condition, a small DC signal needs to be extracted from the large ripple current where the DC signal is due to about 10 mA of current in a 0.5 ohms of resistance presented by the NMOS transistor. The DC signal is therefore only a 5 mV signal in a 50 mV ripple. Meanwhile, the NMOS transistor is being switched on and off as a result of the voltage mode PWM control. The small DC signal and the switching states of the NMOS current make it difficult to use conventional current sensing techniques to carry out the necessary measurements to detect light load conditions.

Therefore, an improved method for load detection in a switching regulator and especially in a voltage mode switching regulator is desired.

SUMMARY OF THE INVENTION

According to one embodiment of the present invention, a circuit for sensing a voltage across a power switch is described. The power switch is controlled by a first control signal for turning the power switch on and off to generate a switching voltage at a first current handling terminal of the power switch. The circuit includes a transmission gate, a low pass filter and a comparator. The transmission gate includes an input terminal coupled to the first current handling of the power switch, an output terminal, and a control terminal. The control terminal of the transmission gate is coupled to receive a signal corresponding to the first control signal such that the transmission gate is turned on whenever the power switch is turned on. The output terminal of the transmission gate provides a sampled voltage indicative of the voltage across the power switch when the power switch is turned on. The low pass filter has an input terminal coupled to the output terminal of the transmission gate for low pass filtering the sampled voltage and an output terminal providing a filtered voltage. Finally, the comparator has a first and second input terminals coupled to receive the filtered voltage and a reference voltage. The comparator provides an output signal having a first value when the filtered voltage is less than the reference voltage and a second value when the filtered voltage is greater than the reference voltage.

By selecting an appropriate value for the reference voltage in the comparator, the circuit can be used as a load sensing circuit to sense whether the power switch is operating under light load conditions. The output signal of the comparator can be used to reconfigure the power switch to handle the light load conditions.

The present invention is better understood upon consideration of the detailed description below and the accompanying drawings.

DETAILED DESCRIPTION OF THE PREFERRED EMBODIMENTS

In accordance with the principles of the present invention, a load sensing circuit for sensing a small current in a high ripple condition across a power MOSFET switch operates to sample the voltage or current across the power MOSFET switch only when the switch is on. The sampled signal is filtered to remove high frequency ripple which filtered signal can then be used for determining the load condition under which the power MOSFET switch is being operated. The load sensing circuit has particular application in voltage mode switching regulators for detecting light load conditions at the output power switches. In one embodiment, the load sensing circuit includes a transmission gate coupled to the output node of the power switches for sampling the switch output voltage and a low pass filter coupled to remove high frequency transients from the sampled signal. The load sensing circuit further includes a comparator comparing the filtered signal with a reference voltage. The load sensing circuit provides an output signal indicative of the load condition under which the power MOSFET is being operated.

Figure 1:
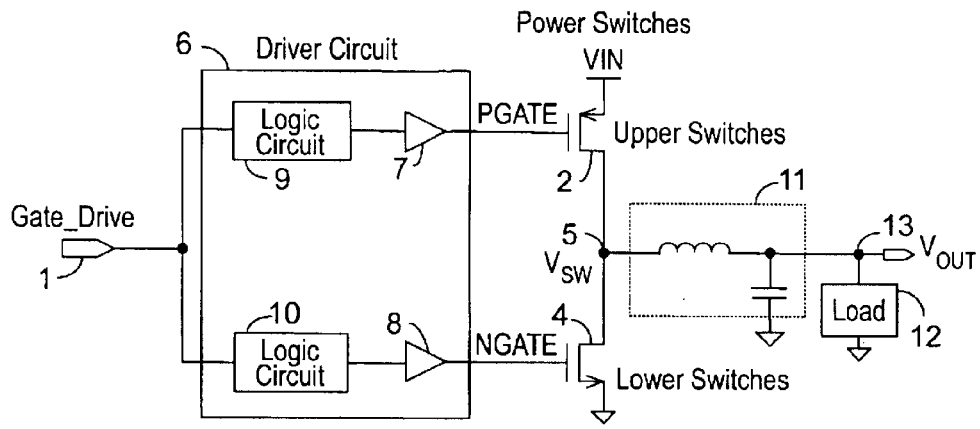
FIG. 1 illustrates an output stage of a conventional switching regulator.
Figure 3:
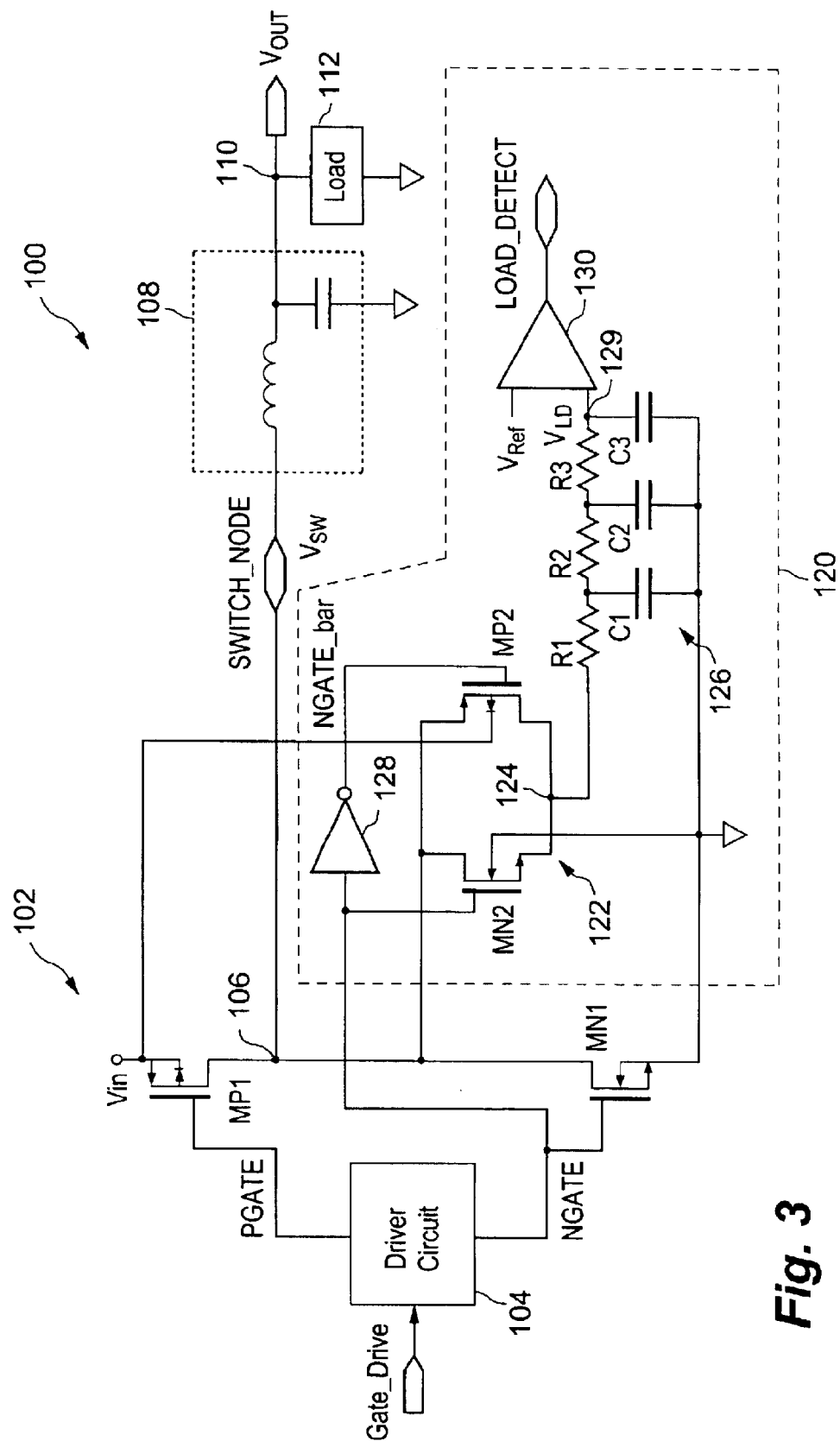
FIG. 3 is a circuit diagram of a load sensing circuit being incorporated at the output stage of a voltage mode switching regulator according to one embodiment of the present invention.

FIG. 3 is a circuit diagram of a load sensing circuit being incorporated at the output stage of a voltage mode switching regulator according to one embodiment of the present invention. Referring to FIG. 3, output stage 102 of switching regulator 100 is illustrated, as including a driver circuit 104 and a pair of serially connected power switches MP1 and MN1 connected between the input voltage Vin and the ground potential. Driver circuit 104 receives a Gate_Drive control signal and generates control signals PGATE and NGATE for driving the two power switches. As describe above with reference to FIG. 1, driver circuit 104 includes logic circuitry for controlling the turning on and off of the power switches and may include delay circuitry for avoiding shoot-through conditions. Driver circuit 104 may also include circuitry for turning off both switches to put the switches in a passive state. In the present illustration, the Gate_Drive signal is logically related to the PGATE control signal for driving the upper power switch MP1 and the NGATE control signal for driving the lower power switch MN1. That is, the Gate_Drive signal has a first state for turning on the upper switch MP1 and turning off the lower switch MN1, and a second state for turning on the lower switch MN1 and turning off the upper switch MP1.

Moreover, in the present illustration, the upper switch and the lower switch are implemented as MOSFET devices or MOS transistors. More specifically, the upper switch is implemented as a PMOS transistor MP1 while the lower switch is implemented as an NMOS transistor MN1. The common node (also referred to as switch node 106) between the upper switch MP1 and lower switch MN1 provides a switch output voltage $V_{SW}$ being the regulated output voltage of the switching regulator. Voltage $V_{SW}$ is typically coupled to a filter circuit, such as an LC filter circuit 108 including an inductor and a capacitor, for generating an output voltage $V_{OUT}$ (on node 110) having a substantially constant magnitude. Output voltage $V_{OUT}$ is then used to drive a load 112 which load represents a circuit or circuits whose power is being supplied by the switching regulator at the $V_{OUT}$ voltage level. The switching regulator may be coupled to supply power to a variety of loads and the load condition can charge during the operation of the switching regulator. As described above, in order to improve the efficiency of the switching regulator, it is often necessary to determine the load condition under which the switching regulator is being operated so that the switching regulator can be reconfigured to maintain high efficiency of operation, despite changing load conditions.

In FIG. 3, only the output stage of switching regulator 100 is shown. One of ordinary skill in the art would appreciate that switching regulator 100 includes other circuit components such as a voltage feedback circuit and error amplifiers for providing control signals to regulate the switch output voltage $V_{SW}$. A voltage mode switching regulator will further include a PWM comparator comparing an error signal with an oscillating ramp signal for generating the Gate_Drive signal to control the on-off times of the power switches. The exact configuration and topology of switching regulator 100 is not essential to the application and operation of the load sensing circuit of the present invention. The load sensing circuit of the present invention can be incorporated in a variety of switching regulator topologies for use in load detection. Furthermore, the output stage of switching regulator 100 shown in FIG. 3 is illustrative only and one of ordinary skill in the art will appreciate that the output stage of a switching regulator can assume other topologies. For example, the output stage of a switching regulator may include two NMOS transistors as the upper and lower switches. The topology of the output stage also depends on whether the switching regulator is configured to step-up or step-down the input voltage Vin. One of ordinary skill in the art, upon being apprised of the present disclosure, would know how to incorporate the load sensing circuit of the present invention to switching regulators have various output stage topologies for detecting load conditions at the power switches of the switching regulators.

Referring again to FIG. 3, a load sensing circuit 120 is coupled to output stage 102 of switching regulator 100 for detecting the load condition under which the switching regulator is being operated. Specifically, load sensing circuit 120 includes a transmission gate 122 having an input terminal coupled to the drain terminal (switch node 106) of the lower power switch (transistor MN1) and an output terminal (node 124) coupled to a low pass filter 126. Transmission gate 122 also includes a control terminal coupled to receive the gate control signal NGATE driving lower power switch MN1.

In operation, transmission gate 122 samples the voltage across lower power switch MN1 when switch MN1 is on and couples the sampled voltage to low pass filter 126 for filtering. One of ordinary skill in the art would appreciate that the transmission gate is a bidirectional device and that the input and output terminal designations are interchangeable. In the present description, the terminals of transmission gate 122 is designated as the input and output terminals for ease of discussion. In the present embodiment, transmission gate 122 is implemented as the parallel connection of a pair of complementary MOSFET devices: NMOS transistor MN2 and PMOS transistor MP2. In other embodiments, transmission gate 122 can assume other configurations, such as including only a single NMOS transistor.

Transmission gate 122 is controlled by the same signal NGATE that controls lower power switch MN1. Specifically, the NGATE signal is coupled directly to the gate terminal of NMOS transistor MN2 and to an input terminal of an inverter 128. The inverted NGATE signal NGATE_bar is coupled to the gate terminal of PMOS transistor MP2. Thus, NMOS transistor MN2 and PMOS transistor MP2 are turned on and off in synchronous with the lower power switch MN1 based on the control of the NGATE signal. That is, when lower power switch MN1 is turned on, transmission gate 122 is turned on. When lower power switch MN1 is turned off, transmission gate 122 is turned off.

In the present embodiment, low pass filter 126 is formed as a multiple pole RC low pass filter. Specifically, low pass filter 126 is implemented as a RC network including the cascaded connection of three serially connected resistor/capacitor pairs R1/C1, R2/C2 and R3/C3, as shown in FIG. 3. Low pass filter 126 receives the sampled signal from transmission gate 122 on node 124 and operates to filter out high frequency ripples in the sampled signal, leaving only the low frequency signal for use in load detection. Low pass filter 126 ensures that transients in the switch output voltage $V_{SW}$ sampled by transmission gate 122 will not trigger the load detection threshold. Low pass filter 126 provides an output voltage, denoted load detect voltage $V_{LD}$, at the output node of the filter circuit (node 129).

Figure 2:
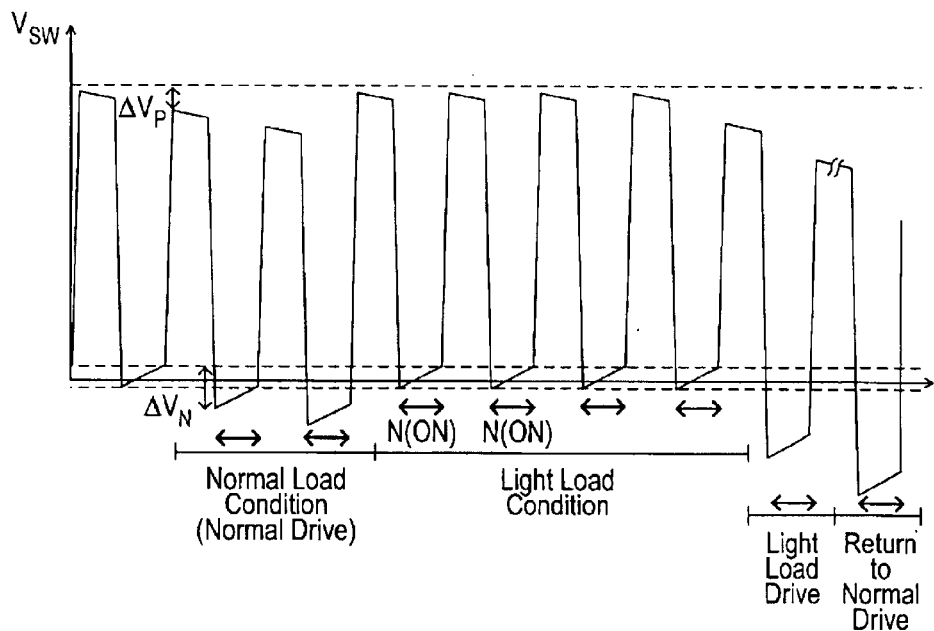
FIG. 2 illustrates representative voltage waveform of switch output voltage $V_{SW}$ at the switch node of the power switches of a voltage mode switching regulator.

In operation, switching regulator 100 generates switch output voltage $V_{SW}$ at node 106 for regulating output voltage $V_{OUT}$ at a constant magnitude. In a voltage mode PWM control switching regulator, the pulse width of the on-time of the upper power switch is varied to control the peak current in the inductor of LC filter circuit 108 so as to maintain regulation. The representative voltage waveform for switch output voltage $V_{SW}$ is shown in FIG. 2. When upper switch MP1 is turned on, voltage $V_{SW}$ increases to charge the inductor in filter circuit 108. When the lower switch MN1 is turned on, voltage $V_{SW}$ decreases to near ground to discharge the inductor in filter circuit 108. As shown in FIG. 2, switch output voltage $V_{SW}$ bounces between a high voltage level and a low voltage level as a result of upper switch MP1 and lower switch MN1 being turned on alternately.

Because transmission gate 122 of loading sensing circuit 120 is operated synchronously with lower switch MN1, whenever switch MN1 is turned on, transmission gate 122 is turned on to sample the voltage across the lower switch (NMOS transistor MN1). In FIG. 2, the double-headed arrow lines indicate the time the NMOS transistor MN1 is on where the voltage across the NMOS transistor is being sampled and measured by load sensing circuit 120. The voltage across the NMOS transistor MN1 is a voltage $\Delta V_N$ which voltage increases for heavy load conditions and decreases for light load conditions. When voltage $\Delta V_N$ is sampled and filtered over a number of switching cycles, low pass filter 126 provides an average $\Delta V_N$ voltage value as load detect voltage $V_{LD}$ at output node 129. Essentially, load sensing circuit,120 operates to average the voltage across lower switch MN1 whenever the lower switch is turned on.

To facilitate load detection, load detect voltage $V_{LD}$ is coupled to a comparator 130 for comparing the load detect voltage $V_{LD}$ to a reference voltage $V_{Ref}$. Comparator 130 provides a load_detect signal which can be used to reconfigure switching regulator 100 for handling the changing load conditions.

In one embodiment, when load sensing circuit 120 is configured to sense light load conditions, the reference voltage $V_{Ref}$ is set to a low voltage threshold level. When the load detect voltage $V_{LD}$ drops below the reference voltage $V_{Ref}$, the load_detect signal is asserted. Switching regulator 100 can then be reconfigured to handle the light load condition, such as by varying the switching frequency of the switch output voltage $V_{SW}$. When the load detect voltage $V_{LD}$ returns to a level greater than the reference voltage $V_{Ref}$, the load_detect signal is deasserted and switching regulator 100 may resume operation for a normal or "full" load condition.

The voltage waveform for voltage $V_{SW}$ shown in FIG. 2 illustrates the different operation regimes of switching regulator 100 where load sensing circuit 120 operates to detect the changing load conditions. During the second and third switch cycles, switching regulator 100 is experiencing normal load conditions and the voltage $\Delta V_N$ across transistor MN1 is larger than the reference voltage $V_{Ref}$. Thus, output stage 102 assumes normal drive configuration. However, over the next several switching cycles, the switching regulator is experiencing light load conditions and the voltage $\Delta V_N$ across transistor MN1 becomes very small. Load sensing circuit 120 operates to sample and average voltage $\Delta V_N$ across transistor MN1 over several sampling cycles. When averaged and filtered load_detect voltage $V_{LD}$ falls below the reference voltage $V_{Ref}$, the load_detect signal is asserted and switching regulator 100 can assume light load drive configuration. At some cycles later, when load sensing circuit 120 detects that load conditions have returned to normal, such as when the averaged and filtered load_detect voltage $V_{LD}$ rises above the reference voltage $V_{Ref}$, switching regulator 100 can revert to normal drive configuration.

In an alternate embodiment of the present invention, comparator 130 can be implemented as a hysteresis comparator. That is, the reference voltage $V_{Ref}$ is changed when the output of the comparator is asserted or deasserted to prevent chattering of the output signal load_detect when voltage $V_{LD}$ varies too close to a specific reference voltage level. In one embodiment, reference voltage $V_{Ref}$ is set to a first voltage level for light load detection. When load detect voltage $V_{LD}$ falls below the first voltage level, comparator 130 asserts the output signal load_detect and reference voltage $V_{Ref}$ is switched to a second voltage level higher than the first voltage level. Then, the load_detect signal will not be deasserted until the load detect voltage $V_{LD}$ increases above the second, higher voltage level. In this manner, chattering of the load_detect signal is prevented if voltage $V_{LD}$ drifts about the first voltage level.

Figure 4:
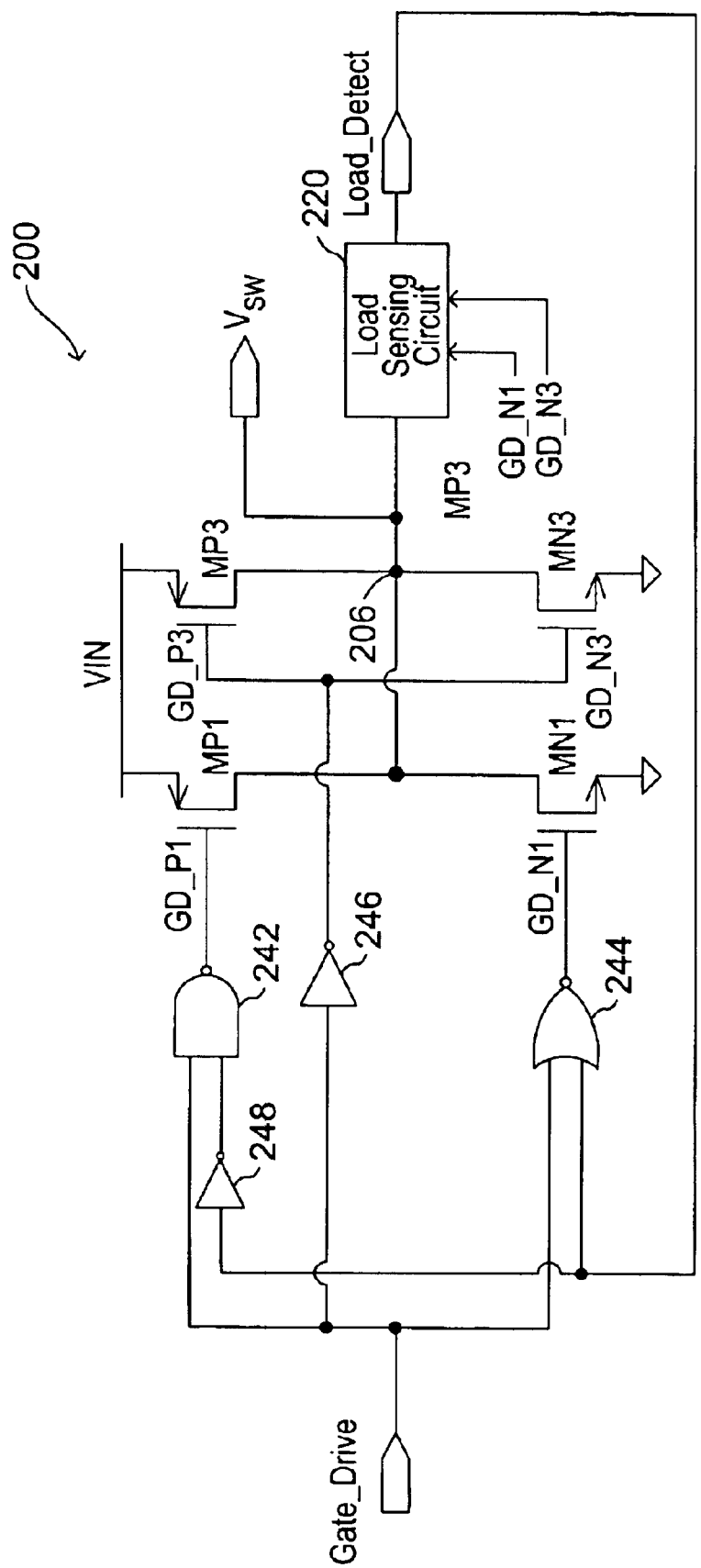
FIG. 4 is a circuit diagram of an output stage of a voltage mode switching regulator configured to handle light and full load conditions where the output stage incorporates a load sensing circuit according to an alternate embodiment of the present invention.

As discussed above, load detection circuit 120 of the present invention generates a load_detect signal indicating a certain load condition under which the switching regulator is being operated. For example, load detection circuit 120 can be configured to detect light load conditions by selecting the proper voltage value for the reference voltage $V_{Ref}$. The load_detect signal can be used by the switching regulator to reconfigure its operation to handle the changing load conditions. A switching regulator including an output stage configured to handle light and full (or normal) load conditions is illustrated in FIG. 4. FIG. 4 also illustrates logic circuits which can be incorporated in the driver circuit for the power switches for reconfiguring the output stage depending on the detected load conditions.

Referring to FIG. 4, each of the upper power switch and the lower power switch is implemented by two transistors, one transistor being much smaller than the other. Specifically, in switching regulator 200, the upper switch includes PMOS transistor MP1 and PMOS transistor MP3, connected in parallel, where transistor MP3 is smaller than transistor MP1. Similarly, the lower switch includes NMOS transistor MN1 and NMOS transistor MN3, connected in parallel, where transistor MN3 is smaller than transistor MN1. The gate control signals GD_P3 and GD_N3 for the smaller transistors MP3 and MN3, respectively, are derived from the Gate_Drive control signal operating to turn on either the upper or the low power switch. On the other hand, the gate control signals GD_P1 and GD_N1 for the larger transistors MP1 and MN1, respectively, are under configuration control in response to the Gate_Drive control signal and the load_detect signal generated by load sensing circuit 220. In the present illustration, load sensing circuit 220 is configured to sense light load conditions.

Under normal load conditions, both transistors of the power switches are engaged to drive switch node 206. That is, when the lower switch is to be turned on, both transistors MN1 and MN3 are turned on. Alternately, when the upper switch is to be turned on, both transistors MP1 and MP3 are turned on.

When the voltage across the NMOS transistors drops below the predetermined voltage level $V_{Ref}$, the load_detect signal is asserted to indicate that a light load condition is detected. The load_detect signal is coupled to control the gate control signals driving the larger transistors MP1 and MN1. As a result of the load_detect signal being asserted, the larger transistors MP1 and MN1 are forced to be turned off, regardless of the state of the Gate_Drive control signal, and no longer contribute to the switching control of switch node 206. Thus, under light load conditions, only the smaller transistors MP3 and MN3 are operating to switch the output voltage $V_{SW}$ at switch node 206.

In the present embodiment, load sensing circuit 220 is assumed to include a hysteresis comparator receiving two different voltage levels as reference voltage $V_{Ref}$. When the load_detect signal is asserted, the reference voltage $V_{Ref}$ of the comparator switches to the second, higher threshold voltage level to detect when the load driven by switching regulator 200 has returned to full or normal load condition. When normal load condition is detected and the load_detect signal is deasserted, the larger transistors MP1 and MN1 are engaged again for driving switch node 206. Thus, depending on the value of the Gate_Drive control signal, both the PMOS transistors MP1 and MP3 or both the NMOS transistors MN1 and MN3 are turned on to drive switch node 206 under normal load conditions.

The output stage of switching regulator 200 improves light load efficiency by reducing the gate drive capacitance during light load conditions. In one embodiment, the gate drive current is 300 $\mu$A and the size ratio of the large transistor to the small transistor is 10:1. Thus, during light load conditions, a 90% reduction in gate drive capacitance can be realized. Switching regulator 200 configured to include small/large transistors in the output stage and the load sensing circuit of the present invention can be operated at very high efficiency at light load and normal load conditions.

It is understood that switching regulator efficiency is the ratio of the output power (Pout) to the input power (Pin) or Pout/Pin. In a switching regulator, there are three power terms to consider. The first power term is the quiescent current $I_Q$ drawn by the control circuits, represented by the equation $Vin*I_Q$. The second power term is the drive current drawn by the gate of the power switches, represented by the equation $Vin*I_{G-(ave)}$. The third power term is the output current drawn by the load, represented by the equation $R_{FET}*I_{out-rms}^2$.

The first power term ($Vin*I_Q$) is constant with respect to changing load conditions. In light load conditions, the output current power term ($R_{FET}*I_{out-rms}^2$) term goes to zero as the output current becomes very small, rendering the third power term insignificant. Thus, at light load conditions, the gate drive current power term dominates the total power consumption of the switching regulator. By reducing the gate drive current at light load condition, the efficiency of the switching regulator can increase significantly. In switching regulator 200 of FIG. 4, the gate drive current at light load conditions is minimized by turning off the large transistors and leaving only the small transistors (transistor MP3 or MN3) to drive the switch node. In this manner, gate drive loss is reduced during light load conditions and light load efficiency of the switching regulator is improved.

FIG. 4 further illustrates one embodiment of a driver circuit which can be used to generate the gate control signals for transistors MP1, MP3, MN1 and MN3 based on the Gate_Drive control signal and the load_detect signal. One of ordinary skill in the art would appreciate that other logic circuitry can be used to generate the gate control signals, depending on the application and other design considerations (such as anti-shoot-through protection) for the output stage of the switching regulator. In switching regulator 200 of FIG. 4, a NAND gate 242 is coupled to drive the large PMOS transistor MP1 and a NOR gate 244 is coupled to drive the large NMOS transistor MN1. NAND gate 242 receives as input signals the Gate_Drive control signal and the inverse of the load_detect signal (inverted through inverter 248). NOR gate 244 receives as input signals the Gate_Drive control signal and the load_detect signal. In this manner, when the load_detect signal is asserted, NAND gate 242 generates a logical "hi" output as GD_P1 signal and NOR gate 244 generates a logical "lo" output as GD_N1 signal, regardless of the state of the Gate_Drive control signal. Thus, transistor MP1 and transistor MN1 are turned off when light load condition is detected. The Gate Drive control signal is also coupled to an inverter 246 whose output terminal is coupled to drive the gate terminals of the small transistors MP3 and MN3. In this manner, transistors MP3 and MN3 maintain the normal switching operations in response to the Gate_Drive control signal.

Figure 5:
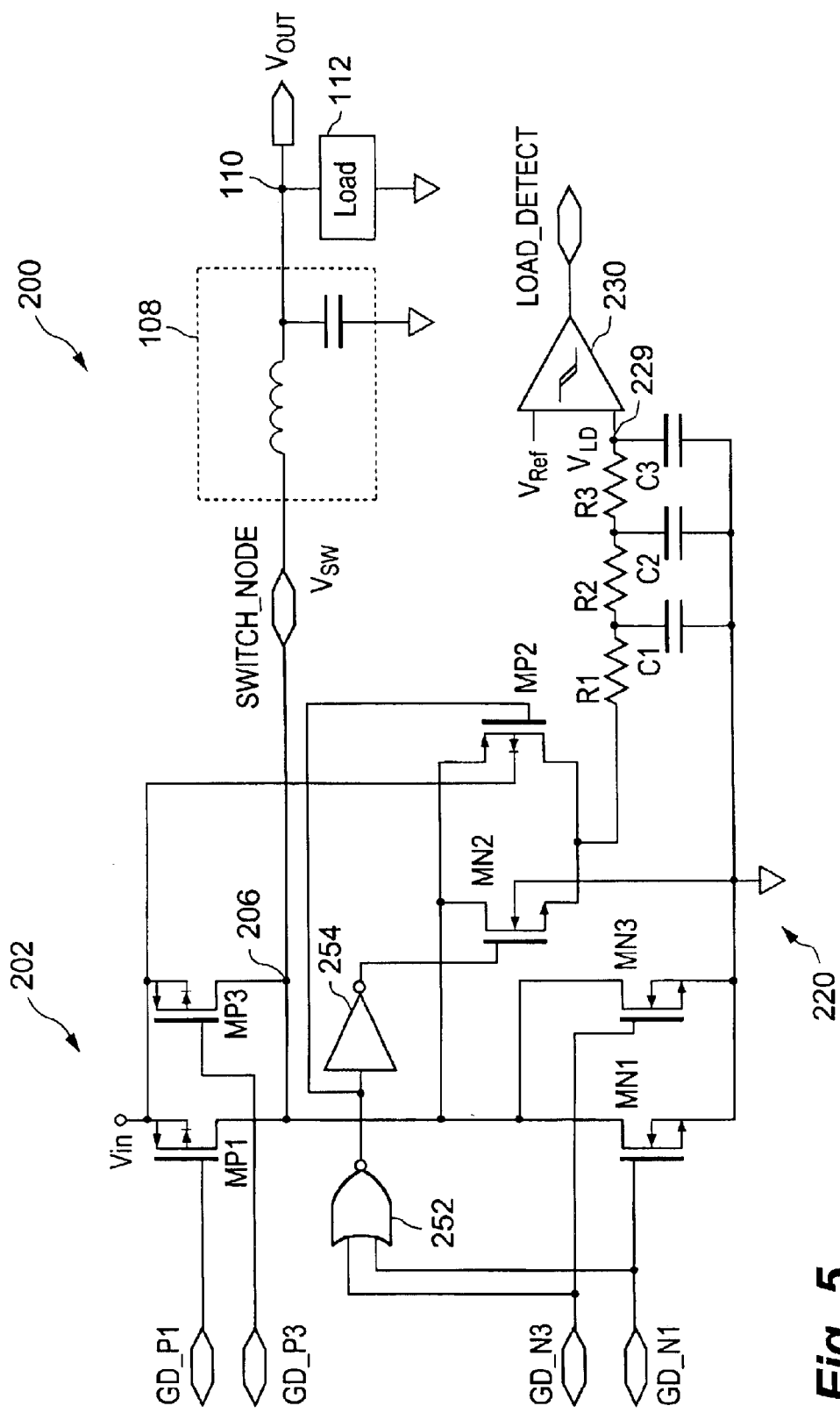
FIG. 5 is a detailed circuit diagram of a load sensing circuit being incorporated at the output stage of the switching regulator of FIG. 4 according to an alternate embodiment of the present invention.

FIG. 5 is a detailed circuit diagram of a load sensing circuit being incorporated at the output stage of the switching regulator of FIG. 4 according to an alternate embodiment of the present invention. Referring to FIG. 5, load sensing circuit 220 is configured in the same manner as load sensing circuit 120 of FIG. 3 and includes a transmission gate coupled to a low pass filter for generating a load detect voltage $V_{LD}$ at node 229. The load detect voltage $V_{LD}$ is coupled to hysteresis comparator 230 for generating the load_detect signal using reference voltage $V_{Ref}$. In the present embodiment, the transmission gate (transistors MN2 and MP2) of load sensing circuit 220 is driven by a combination of the gate control signals GD_N1 and GD_N3 so that the transmission gate is turned on when either NMOS transistor MN1 or NMOS transistor MN3 is turned on. Specifically, the gate control signals GD_N1 and GD_N3 are coupled to a NOR gate 252. The output of NOR gate 252 is coupled to drive PMOS transistor MP2. The output of NOR gate 252 is also coupled through an inverter 254 to drive NMOS transistor MN2. In this manner, the transmission gate of load sensing circuit 220 is turned on whenever one or both of NMOS transistors MN1 and MN3 are turned on to sample the voltage across the NMOS transistor(s).

As thus configured, load sensing circuit 220 operates to detect light load conditions at the power switches of switching regulator 200 and allow switching regulator 200 to reconfigure the output stage for light load operation. Load sensing circuit 220 can also operate to detect a return to normal load condition so that the switching regulator can revert to normal load operation. Of course, other combination of logic gates are possible to implement the control of the transmission gate, such as by using an OR gate with an inverter where the inverter output drives the PMOS transistor MP2 and the OR gate output drives the NMOS transistor MN2. The use of NOR gate 252 with inverter 254 in the present embodiment is illustrative only.

In the embodiment described in FIGS. 4 and 5, load sensing circuit 220 is configured to detect light load conditions and the output stage of the switching regulator is configured to handle light load conditions by reducing the gate drive capacitance. The load sensing circuit of the present invention can be configured to detect heavy load conditions. In light load sensing, the control signal for the lower power switch is used by the load sensing circuit to sense the current flow in the lower power switch. Sensing at the lower power switch is sometimes referred to as "low-side sensing." When the load sensing circuit of the present invention is configured to sense heavy load conditions, the control signal for the upper power switch is used by the load sensing circuit to sense the current flow in the upper power switch. Sensing at the upper power switch is sometimes referred to as "top-side sensing."

Figure 6:
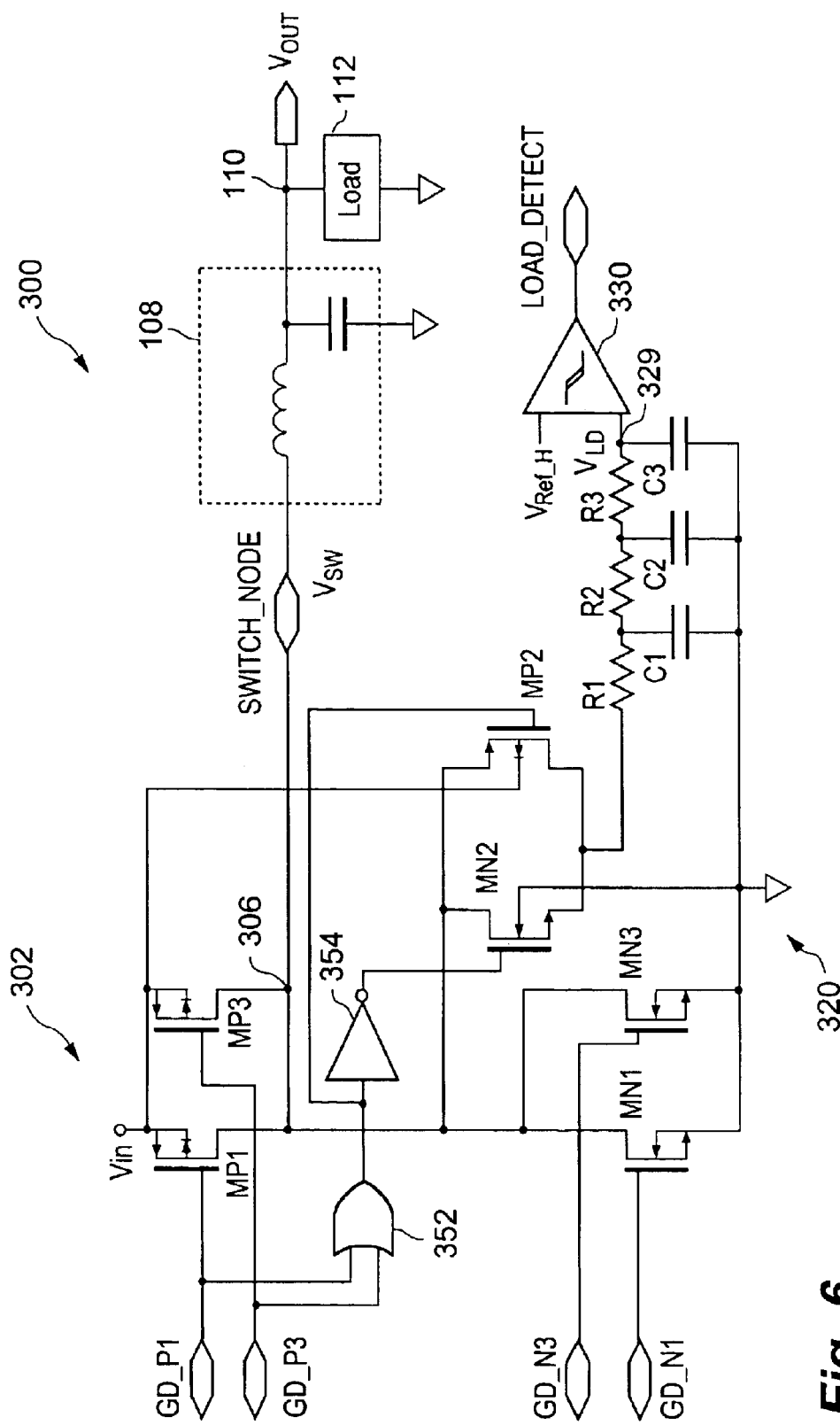
FIG. 6 is a circuit diagram of a load sensing circuit being incorporated at the output stage of the switching regulator for providing top-side sensing according to an alternate embodiment of the present invention.

FIG. 6 is a circuit diagram of a load sensing circuit being incorporated at the output stage of the switching regulator for providing top-side sensing according to an alternate embodiment of the present invention. Referring to FIG. 6, load sensing circuit 320 is configured in the same manner as described above with reference to FIG. 5 and includes a transmission gate coupled to a low pass filter for generating a load detect voltage $V_{LD}$ at node 329. The load detect voltage $V_{LD}$ is coupled to hysteresis comparator 330 for generating the load_detect signal using a reference voltage $V_{Ref\_H}$. In order to enable top-side sensing for sensing heavy load conditions, the transmission gate made up of transistors MN2 and MP2 is driven by a combination of the gate control signals GD_P1 and GD_P3 driving the upper power switches MP1 and MP3 respectively. Thus, the transmission gate is turned on when either PMOS transistor MP1 or PMOS transistor MP3 is turned on. Specifically, the gate control signals GD_P1 and GD_P3 are coupled to an AND gate 352. The output of AND gate 352 is coupled to drive PMOS transistor MP2. The output of AND gate 352 is also coupled to an inverter 354 to drive NMOS transistor MN2. In this manner, the transmission gate of load sensing circuit 320 is turned on whenever one or both of PMOS transistors MP1 and MP3 are turned on to sample the voltage across the PMOS transistor(s). Of course, other combination of logic gates are possible to implement the control of the transmission gate, such as by using an NAND gate with an inverter where the inverter output drives the PMOS transistor MP2 and the NAND gate output drives the NMOS transistor MN2. The use of AND gate 352 with inverter 354 in the present embodiment is illustrative only.

In the present embodiment, the reference voltage $V_{Ref\_H}$ is set to a high voltage level. When the load detect voltage $V_{LD}$ increases beyond the reference voltage $V_{Ref\_H}$, the load_detect signal is asserted. In response to the load_detect signal, witching regulator 300 can then be reconfigured to handle the heavy load condition, such as by turning on output power switches with larger drive strengths (transistors MN1 and MP1). When the load detect voltage $V_{LD}$ returns to a level smaller than the reference voltage $V_{Ref\_H}$, the load_detect signal is deasserted and switching regulator 300 may resume operation for a normal load condition, such as by turning off the large transistors. In other embodiments, heavy load conditions can be handled by increasing the switching frequency of the switch output voltage $V_{SW}$.

Furthermore, in switching regulator 200 of FIGS. 4 and 5, the upper and lower power switches each includes two transistors of dissimilar sizes where the larger transistor is turned off in light load conditions. In other embodiments, it is possible to implement the output stage by using a pair of, dissimilarly sized transistors only for the lower power switch or only for the upper power switch. In that case, either the lower or the upper power switch will be reconfigured to handle a light load condition or a heavy load condition.

The above detailed descriptions are provided to illustrate specific embodiments of the present invention and are not intended to be limiting. Numerous modifications and variations within the scope of the present invention are possible. The present invention is defined by the appended claims.

I claim:

1. A circuit for sensing a voltage across a power switch, said power switch having a first current handling terminal, a second current handling terminal and a control terminal receiving a first control signal, said first control signal turning said power switch on and off to generate a switching voltage at said first current handling terminal, said circuit comprising:

a transmission gate having an input terminal coupled to said first current handling of said power switch, an output terminal, and a control terminal, said control terminal coupled to receive a signal corresponding to said first control signal such that said transmission gate is turned on whenever said power switch is turned on, said output terminal providing a sampled voltage indicative of the voltage across said power switch when said power switch is turned on;

a low pass filter having an input terminal coupled to said output terminal of said transmission gate and an output terminal providing a filtered voltage; and a comparator having a first and second input terminals coupled to receive said filtered voltage and a reference voltage, said comparator providing an output signal having a first value when said filtered voltage is less than said reference voltage and a second value when said filtered voltage is greater than said reference voltage.

2. The circuit of claim 1, wherein said power switch comprises an NMOS transistor having a drain terminal being said first current handling terminal and coupled to a second power switch, a source terminal being said second current handling terminal and coupled to a first supply voltage and a gate terminal being said control terminal, and wherein said NMOS transistor and said second power switch are turned on alternately to generate said switching voltage at said drain terminal of said NMOS transistor, said NMOS transistor turning on to cause said switching voltage to decrease while the second power switch turning on to cause said switching voltage to increase.

3. The circuit of claim 1, wherein said power switch comprises a PMOS transistor having a drain terminal being said first current handling terminal and coupled to a second power switch, a source terminal being said second current handling terminal and coupled to a first supply voltage and a gate terminal being said control terminal, and wherein said PMOS transistor and said second power switch are turned on alternately to generate said switching voltage at said drain terminal of said PMOS transistor, said PMOS transistor turning on to cause said switching voltage to increase while the second power switch turning on to cause said switching voltage to decrease.

4. The circuit of claim 1, wherein said transmission gate comprises an NMOS transistor and a PMOS transistor connected in parallel between the input terminal and the output terminal of said transmission gate, the gate terminal of said NMOS transistor is driven by a second control signal corresponding to said first control signal and the gate terminal of said PMOS transistor is driven by a signal corresponding to an inverse of said second control signal.

5. The circuit of claim 1, wherein said low pass filter comprises a resistor-capacitor (RC) filter network.

6. The circuit of claim 5, wherein said resistor-capacitor (RC) filter network comprises:

a first resistor coupled between said output terminal of said transmission gate and a first node; and a capacitor coupled between said first node and a first supply voltage.

7. The circuit of claim 1, wherein said comparator comprises a hysteresis comparator and said reference voltage comprises a first voltage value and a second, larger voltage value, and wherein said reference voltage is set to said second, larger voltage value when said output signal has said first value, and said reference voltage is set to said first voltage value when said reference voltage has said second value.

8. An output circuit for a switching regulator comprising:

a first power switch and a second power switch connected in series between a first supply voltage and a second supply voltage;

a driver circuit receiving a switch control signal and generating a first control signal and a second control signal corresponding to said switch control signal for driving said first power switch and said second power switch, respectively, said driver circuit causing said first power switch and said second power switch to turn on alternately for generating a switching voltage at a switch node between said first power switch and said second power switch; and a load sensing circuit for sensing the load condition driven by said first power switch and said second power switch, said load sensing circuit comprising:

a transmission gate having an input terminal coupled to said switch node of said first and second power switches, an output terminal, and a control terminal, said control terminal coupled to receive a signal corresponding to said second control signal driving said second power switch such that said transmission gate is turned on whenever said second control signal is asserted to turn said second power switch on, said output terminal providing a sampled voltage indicative of the voltage across said second power switch when said second power switch is turned on;

a low pass filter having an input terminal coupled to said output terminal of said transmission gate for low pass filtering said sampled voltage and an output terminal providing a filtered voltage; and a comparator having a first and a second input terminals coupled to receive said filtered voltage and a reference voltage, said comparator providing an output signal having a first value when said filtered voltage is less than said reference voltage and a second value when said filtered voltage is greater than said reference voltage.

9. The circuit of claim 8, wherein said second power switch comprises an NMOS transistor having a drain terminal coupled to said switch node, a source terminal coupled to said second supply voltage and a gate terminal being driven by said second control signal.

10. The circuit of claim 9, wherein said first power switch comprises a PMOS transistor having a drain terminal coupled to said switch node, a source terminal coupled to said first supply voltage and a gate terminal being driven by said first control signal.

11. The circuit of claim 8, wherein said transmission gate comprises an NMOS transistor and a PMOS transistor connected in parallel between the input terminal and the output terminal of said transmission gate, the gate terminal of said NMOS transistor being driven by a third control signal corresponding to said second control signal and the gate terminal of said PMOS transistor being driven by a signal corresponding to an inverse of said third control signal.

12. The circuit of claim 8, wherein said low pass filter comprises a resistor-capacitor (RC) filter network.

13. The circuit of claim 12, wherein said resistor-capacitor (RC) filter network comprises:
   a first resistor coupled between said output terminal of said transmission gate and a first node; and
   a capacitor coupled between said first node and a first supply voltage.

14. The circuit of claim 8, wherein said comparator comprises a hysteresis comparator and said reference voltage comprises a first voltage value and a second, larger voltage value, and wherein said reference voltage is set to said second, larger voltage value when said output signal has said first value, and said reference voltage is set to said first voltage value when said reference voltage has said second value.

15. The circuit of claim 8, wherein said second power switch comprises a first NMOS transistor and a second NMOS transistor connected in parallel between said switch node and said second supply voltage, said second NMOS transistor being smaller than said first MOS transistor, and wherein said second NMOS transistor is driven by a signal corresponding to said second control signal and said first NMOS transistor is driven by a fourth control signal corresponding to said switch control signal and said output signal of said comparator such that said first NMOS transistor is turned off when said output signal of said comparator has said first value.

16. The circuit of claim 15, wherein said first power switch comprises a first PMOS transistor and a second PMOS transistor connected in parallel between the first supply voltage and said switch node, said second PMOS transistor being smaller than said first PMOS transistor, and wherein said second PMOS transistor is driven by a signal corresponding to said first control signal and said first PMOS transistor is driven by a fifth control signal corresponding to said switch control signal and said output signal of said comparator, such that said first PMOS transistor is turned off when said output signal of said comparator has said first value.

17. The circuit of claim 15, wherein the first NMOS transistor is ten times larger than the second NMOS transistor.

18. The circuit of claim 16, wherein the first PMOS transistor is ten times larger than the second PMOS transistor.

19. An output circuit for a switching regulator comprising:
   a first power switch and a second power switch connected in series between a first supply voltage and a second supply voltage;
   a driver circuit receiving a switch control signal and generating a first control signal and a second control signal corresponding to said switch control signal for driving said first power switch and said second power switch, respectively, said driver circuit causing said first power switch and said second power switch to turn on alternately for generating a switching voltage at a switch node between said first power switch and said second power switch; and
   a load sensing circuit for sensing the load condition driven by said first power switch and said second power switch, said load sensing circuit comprising:
      a transmission gate having an input terminal coupled to said switch node of said first and second power switches, an output terminal, and a control terminal, said control terminal coupled to receive a signal corresponding to said first control signal driving said first power switch such that said transmission gate is turned on whenever said first control signal is asserted to turn said first power switch on, said output terminal providing a sampled voltage indicative of the voltage across said first power switch when said first power switch is turned on;
      a low pass filter having an input terminal coupled to said output terminal of said transmission gate for low pass filtering said sampled voltage and an output terminal providing a filtered voltage; and
      a comparator having a first and a second input terminals coupled to receive said filtered voltage and a reference voltage, said comparator providing an output signal having a first value when said filtered voltage is greater than said reference voltage and a second value when said filtered voltage is less than said reference voltage.

20. The circuit of claim 19, wherein said first power switch comprises a PMOS transistor having a drain terminal coupled to said switch node, a source terminal coupled to said first supply voltage and a gate terminal being driven by said first control signal.

21. The circuit of claim 20, wherein said second power switch comprises an NMOS transistor having a drain terminal coupled to said switch node, a source terminal coupled to said second supply voltage and a gate terminal being driven by said second control signal.

22. A method for sensing a voltage across a power switch, said power switch having a first current handling terminal, a second current handling terminal and a control terminal receiving a first control signal, said first control signal turning said power switch on and off to generate a switching voltage at said first current handling terminal, said method comprising:
   sampling a voltage at said power switch when said power switch is turned on;
   filtering the sampled voltage to remove high frequency components;
   comparing the filtered voltage to a reference voltage;
   generating an output signal having a first value when said filtered voltage is less than said reference voltage and a second value when said filtered voltage is greater than said reference voltage.

23. The method of claim 22, wherein said sampling a voltage at said power switch comprises:

coupling a transmission gate to said first current handling of said power switch; and turning on said transmission gate in response to said first control signal, such that said transmission gate samples said voltage across said power switch when said power switch is turned on.

24. The method of claim 22, wherein said reference voltage has a first voltage value and a second, larger voltage value, said method further comprises:

selecting said second voltage value for said reference voltage when said output signal has said first value; and selecting said first voltage value for said reference voltage when said output signal has said second value.

* * * * *